US012725756B2

(12) United States Patent
Meijer

(10) Patent No.: US 12,725,756 B2
(45) Date of Patent: Sep. 1, 2026

(54) FIBER FABRY-PEROT CAVITY LASER PHASE PLATE FOR CHARGED PARTICLE MICROSCOPY

(71) Applicant: FEI Company, Hillsboro, OR (US)

(72) Inventor: Afric Meijer, Waalre (NL)

(73) Assignee: FEI Company, Hillsboro, OR (US)

( * ) Notice: Subject to any disclaimer, the term of this patent is extended or adjusted under 35 U.S.C. 154(b) by 391 days.

(21) Appl. No.: 18/529,239

(22) Filed: Dec. 5, 2023

(65) Prior Publication Data

US 2024/0222066 A1 Jul. 4, 2024

Related U.S. Application Data

(60) Provisional application No. 63/436,214, filed on Dec. 30, 2022.

(51) Int. Cl.

| | |
|---|---|
| ***H01J 37/22*** | (2006.01) |
| ***H01J 37/14*** | (2006.01) |
| ***H01J 37/20*** | (2006.01) |
| ***H01J 37/28*** | (2006.01) |
| ***H01S 3/04*** | (2006.01) |
| ***H01S 3/042*** | (2006.01) |

(Continued)

(52) U.S. Cl.

CPC ............ *H01J 37/226* (2013.01); *H01J 37/14* (2013.01); *H01J 37/20* (2013.01); *H01J 37/28* (2013.01); *H01S 3/0405* (2013.01); *H01S 3/042* (2013.01); *H01S 3/06708* (2013.01); *H01J 2237/0041* (2013.01)

(58) Field of Classification Search

CPC .......... H01J 37/226; H01J 37/14; H01J 37/20; H01J 37/28; H01J 2237/0041; H01S 3/0405; H01S 3/042; H01S 3/06708

See application file for complete search history.

(56) References Cited

U.S. PATENT DOCUMENTS

| | | | |
|---|---|---|---|
| 8,217,352 | B2 | 7/2012 | Reed |
| 10,395,888 | B2 | 8/2019 | Axelrod et al. |
| 11,101,101 | B2 | 8/2021 | Buijsse et al. |

(Continued)

FOREIGN PATENT DOCUMENTS

| | | | |
|---|---|---|---|
| WO | 2011/071819 | A1 | 6/2011 |

OTHER PUBLICATIONS

CN 110071423 A (Year: 2019).*

(Continued)

*Primary Examiner* — Nicole M Ippolito

(57) ABSTRACT

Fiber Fabry-Perot Cavity laser phase plate for microscopy are described herein. In one aspect, a micro Fabry-Perot laser cavity for charged particle microscopy, can include: a first fiber assembly and a second fiber assembly, wherein each of the first fiber and the second fiber assembly includes: an entrance region including a single-mode fiber; a spacer region including a multimode fiber or a transparent substrate; a convergence region including a gradient index fiber or gradient index lens; and a speculum region including a multimode fiber or a transparent substrate, the entrance region, spacer region, the convergence region, and the speculum region being in optical communication with one another, and where a face of the speculum region of the first fiber assembly faces a face of the speculum region of the second fiber assembly, thereby defining a gap therebetween.

20 Claims, 8 Drawing Sheets

(51) Int. Cl.
*H01S 3/06* (2006.01)
*H01S 3/067* (2006.01)

(56) References Cited

U.S. PATENT DOCUMENTS

2013/0037712 A1 2/2013 Glaeser et al.
2021/0096444 A1* 4/2021 Zhang .................. G02F 1/3536
2022/0319803 A1* 10/2022 Axelrod ................. H01J 37/22

OTHER PUBLICATIONS

Extended European Search Report issued in European Patent Application No. EP 23215453.4, mailed May 17, 2024.
Riesen, et al., "Design considerations for graded index fiber tip Fabry-Perot interferometers", Measurement Science and Technology, vol. 32, No. 5, 2021.
Schwartz, et al., "Laser phase plate for transmission electron microscopy", Nat Methods, vol. 16(10), pp. 1016-1020, 2019.

* cited by examiner

600

700

FIBER FABRY-PEROT CAVITY LASER PHASE PLATE FOR CHARGED PARTICLE MICROSCOPY

CROSS-REFERENCE TO RELATED APPLICATIONS

This application claims priority to and the benefit of U.S. Provisional Application No. 63/436,214, "Fiber Fabry-Perot Cavity Laser Phase Plate for Charged Particle Microscopy" (filed Dec. 30, 2022), the entirety of which application is incorporated herein by reference for any and all purposes.

TECHNICAL FIELD

The disclosed technology relates to the field of fiber Fabry-Perot Cavity laser phase plates for charged particle microscopy systems.

BACKGROUND

Phase plates for charged particle microscopy can boost image contrast of microscopy specimens, which can be particularly useful for specimens with low intrinsic contrasts, such as specimens typically found in cryo-electron microscopy (cryo-EM), soft matter in material sciences, and thin lamellae in semiconductors. Phase plates can be incorporated into the microscopy system to boost the contrast of microscopy specimens, which can lower the required dose to record an image and also mitigate potential irradiation damage to the specimen. In some cases, the enhanced image contrast can also provide for faster image acquisition. Existing phase plates, however, can have form factors and/or power consumptions that limit their usage. Accordingly, there is a long-felt need in the field for improved phase plates.

SUMMARY

In meeting the described long-felt needs, the present disclosure provides novel and inventive Fiber Fabry-Perot Cavity laser phase plates for charged particle microscopy.

In one aspect, the present disclosure provides a micro Fabry-Perot laser cavity for charged particle microscopy, comprising: a first fiber assembly and a second fiber assembly, wherein each of the first fiber and the second fiber assembly comprises: an entrance region comprising a single-mode fiber; a spacer region comprising a multimode fiber or a transparent substrate; a convergence region comprising a gradient index fiber or gradient index lens; and a speculum region comprising a multimode fiber or a transparent substrate, the entrance region, spacer region, the convergence region, and the speculum region being in optical communication with one another, and wherein a face of the speculum region of the first fiber assembly faces a face of the speculum region of the second fiber assembly, thereby defining a gap therebetween.

Also provided is a method, comprising: generating, by a charged particle microscope, a charged electron beam, wherein the charged beam travels through a beam column of the charged particle microscope; generating, by a micro Fabry-Perot laser cavity positioned at a diffraction focal plane downstream of the sample, with the first diffraction plane between an upper polepiece and a lower polepiece of the beam column (e.g., for parallel illumination of the sample), in the back focal plane of a sample, a laser beam, wherein a portion the charged particle beam propagates through the laser beam and interacts with the laser beam in the beam column; and capturing, by a charged particle detector of the charged particle microscope, a charged particle image resulting from the interaction.

Further provided is a charged particle microscope, comprising: a charged particle source configured to generate a charged particle beam; a beam column defining a micro Fabry-Perot cavity through which the generated particle beam travels; a magnetic lens defining an upper polepiece and a lower polepiece and housed in the beam column; and a micro Fabry-Perot laser cavity housed in the beam column and positioned at a diffraction focal plane downstream of the sample, with the first diffraction focal plane between the upper polepiece and the lower polepiece (e.g., for parallel illumination of the sample), wherein the micro Fabry-Perot laser cavity is configured to generate a laser beam that travels through the charged particle beam, and optionally the laser beam having an input power of from about 1 μW to about 1 μW, or the micro Fabry-Perot laser cavity defining a gap in the range of from about 1 μm to about 1000 μm, the gap configured such that the laser beam passes therethrough.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown.

DETAILED DESCRIPTION OF ILLUSTRATIVE EMBODIMENTS

Figure 1:
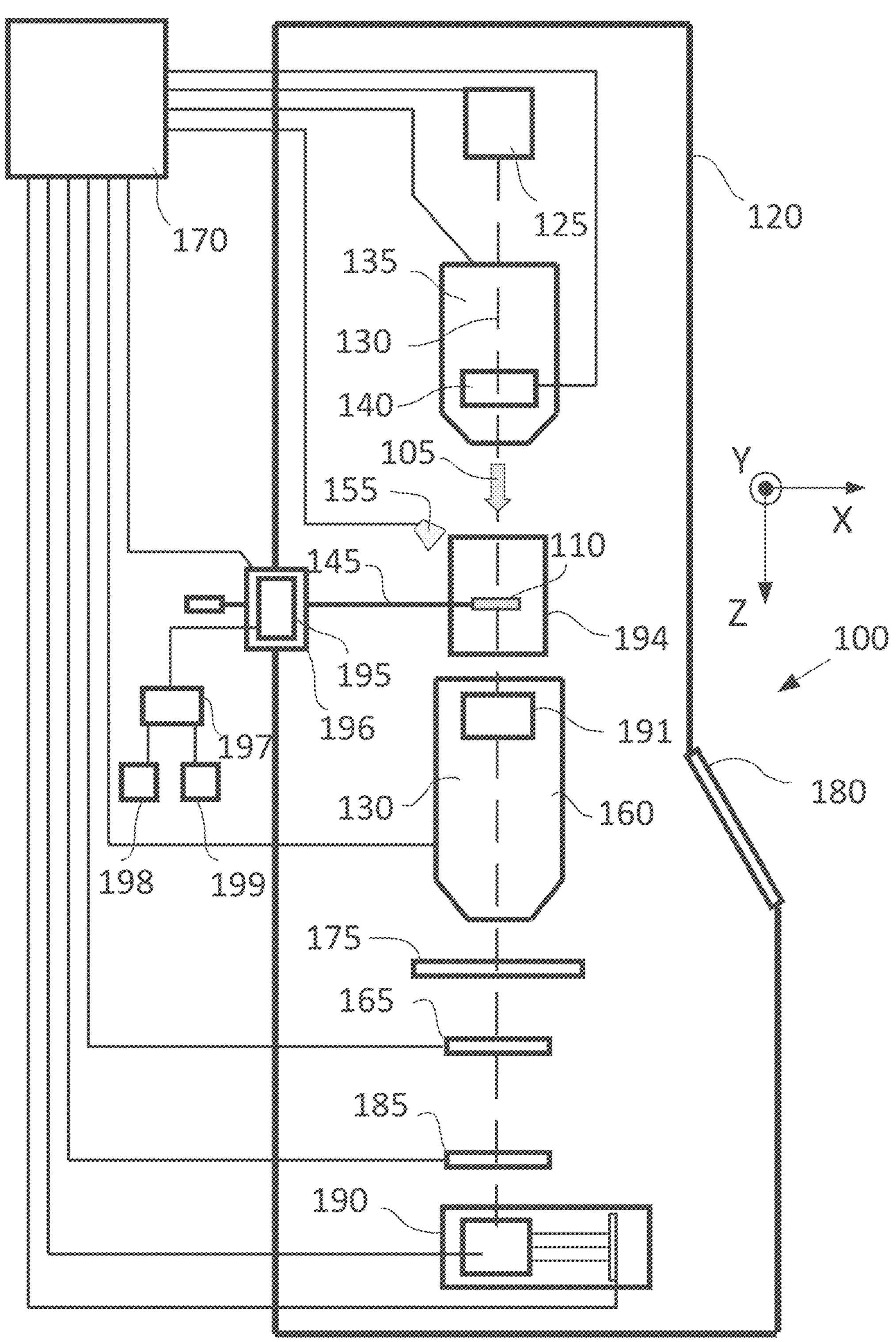
FIG. 1 depicts a microscopy system capable of incorporating micro fiber Fabry-Perot Cavity laser phase plates of the present disclosure.

The present disclosure may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality," as used herein, means more than one. When a range of values is expressed, another embodiment includes from the one particular value and/or to the other particular value. Similarly, when values are expressed as approximations, by use of the antecedent "about," it will be understood that the particular value forms another embodiment. All ranges are inclusive and combinable, and it should be understood that steps can be performed in any order. Any documents cited herein are incorporated by reference in their entireties for any and all purposes.

It is to be appreciated that certain features of the invention which are, for clarity, described herein in the context of separate embodiments, can also be provided in combination in a single embodiment. Conversely, various features of the invention that are, for brevity, described in the context of a single embodiment, can also be provided separately or in any subcombination. Further, reference to values stated in ranges include each and every value within that range. In addition, the term "comprising" should be understood as having its standard, open-ended meaning, but also as encompassing "consisting" as well. For example, a device that comprises Part A and Part B can include parts in addition to Part A and Part B, but can also be formed only from Part A and Part B.

A laser phase plate (LPP) utilizes an optical pondermotive potential to impart the required phase change to the electron beam in a diffraction plane downstream of a TEM sample. Because no material is situated in the electron beam path, which can cause absorption, scattering or energy shifts, the LPP is a nearly ideal implementation of a phase plate for TEM. In a continuous wave LPP implementation, laser light is enhanced and concentrated in an optical cavity to intensities of $GW/cm^2$. Macroscopic cavity types have mirrors with radius of curvature (ROC) larger than 1 mm and require laser power larger than 10 W.

The present disclosure describes a Fiber Fabry-Perot Cavity (FFPC) to form a LPP that can be arranged in a charged particle microscope, such as transmission electron microscope (TEM). The FFPC can include cavity mirrors with a radius of curvature (ROC) smaller than 1 mm, an assembly of fiber optical components for guiding the input beam (e.g., single mode (SM fiber), a cavity mode matching region (e.g., gradient index (GRIN) fiber), and an enhancement of the circulating power between two concave mirrors (e.g., multi-mode (MM) fiber). The dimensions of the FFPC fiber assembly, e.g., a diameter of 125 μm, allow it to fit in the space of a TEM back focal plane, which can be limited to several millimeters between a sample and a lower pole piece of a magnetic lens. The improvement of the FFPC performance with respect to macroscopic cavity types allows the use of fiber optical technology at low laser power, and which may include planar light-wave circuits and integrated photonics. Macroscopic cavity types are typically much larger than FFPCs described herein (e.g., 60 times larger in overall cavity length). Macroscopic cavities are thus limited in where they can be placed in charged particle microscopy systems, such as a relayed diffraction focal plane or planes downstream of the TEM in a transfer optical lens. Further, macroscopic cavities require much larger power inputs for corresponding intra-cavity laser power generation, for example, 400 times the power input compared to the FFPCs described herein.

Disclosed FFPCs can provide nearly three orders of improvement of the intra cavity circulating power with respect to the macroscopic cavity type. This improvement can be utilized to proportionally lower the required laser power from, for example, 20 W to 50 mW. The largest contribution to the reduced power arises from the increased reflectivity of the FFPC, which can act as a counter measure for the decreased cavity length and can positively impact the finesse and power build-up. Similarly, the decreased cavity length can allow for mirrors with smaller ROC, giving rise to a smaller mode focus radius. Such a smaller mode focus radius can also lower the cut-on frequency of the LPP. Table 1 below provides an exemplary and non-limiting comparison between parameters of macroscopic cavities and micro FFPCs described herein.

TABLE 1

Comparison of macroscopic and FFPC cavity parameters shows the improvement of miniaturization.

| Step | Parameter | Macroscopic | Microscopic |
|---|---|---|---|
| 1 | Cavity length [L] | 19996.35 μm | 399.28 μm |
| 2 | ROC | 10.00 mm | 200.00 μm |
| 3 | Reflectivity [R] | 138.00 ppm | 2.34 ppm |
| 4 | Free spectral range [FSR] | 7.50 GHz | 375.67 GHz |
| 5 | Finesse [F] | 2.28E+04 | 1.34E+06 |
| 6 | Linewidth [Δδ] | 0.33 MHz | 0.28 MHz |
| 7 | Quality factor [$Q_m$]: | 8.56E×08 | 10.1 × 08 |
| 8 | Power build-up [BP]: | 7.25E×03 | 4.27E×05 |
| 9 | Mode spacing [$\Delta\nu_{tr}$] | 25.49 MHz | 10,137 MHz |
| 10 | Mode coupling [ε] | 0.90% | 0.90% |
| 11 | Mode focus radius [$w_0$] | 4.25 μm | 1.69 μm |
| 12 | Mode mirror radius [$w_0$] | 796.49 μm | 39.96 μm |
| 13 | Divergence angle [$\theta_{div}$] | 79.65 mrad | 200 mrad |
| 14 | Mirror diameter [$D_{roc}$] | 4141.76 μm | 207.81 μm |
| 15 | Wavelength [λ] | 1064.00 nm | 1064.00 nm |
| | Intra cavity power [Pc] | $1.28 \times 10^5$ W | $2.03 \times 10^4$ W |
| 16 | Mode focus power [P0] | 450.05 $GW/cm^2$ | 450.05 $GW/cm^2$ |
| 17 | Mode mirror power [Pm] | 12.83 $MW/cm^2$ | 808.07 $MW/cm^2$ |
| 18 | Input power [PI] | 19.6 W | 52.71 mW |

FFPCs described herein can combine several desirable properties in a single microscopic device, like a small mode focus radius, high finesse, efficient coupling, robust fiber assembly and open access to the cavity mode. Advantageously, FFPCs significantly improve the cavity parameters such that low power lasers can be used, integrates with fiber optical components and miniaturize dimensions to fit the space of the back focal plane of a TEM of several millimeters.

Turning to FIG. 1, FIG. 1 depicts a microscopy system 100 configured to use an electron beam 105 to observe and/or characterize a sample 110. microscopy system 100 may acquire an image of the sample 110 using the emissions in the transmission region of the microscopy system 100. Thus, system 100 can represent a Transmission Electron Microscope (TEM) or a Scanning Transmission Electron Microscope (STEM).

Within a vacuum enclosure 120, an electron source 125 can produce the beam 105 of electrons that propagates along an electron-optical axis 130 and traverses an electron-optical illuminator 135, serving to direct/focus the electrons onto a chosen part of the sample 110 positioned in sample chamber 194. In some examples, sample 110 can be, e.g., (locally) thinned/planarized or otherwise processed for analysis, but this is not required in all examples.

Also depicted is a deflector 140, which can, inter alia, be used to effect scanning motion of the beam 105. The sample 110 can be held on a sample holder 145 that can be positioned in multiple degrees of freedom by a goniometer 196. For example, the sample 110 can be positioned in a holder capsule of the sample holder that can be moved (inter alia) in the XY plane (see the depicted Cartesian coordinate system; typically, motion parallel to Z and tilt about X/Y will also be possible). Such movement allows different parts of the sample 110 to be illuminated/imaged/inspected by the electron beam 105 traveling along axis 130 (in the Z direction) (and/or allows scanning motion to be performed, as an alternative to beam scanning). If desired, an optional cooling device (not depicted) can be brought into intimate thermal contact with the sample holder 145, so as to maintain it (and the sample 110 thereupon) at cryogenic temperatures, for example. The holder capsule of the sample holder can be scalable, so that the sample can be transferred into and out of the TEM under vacuum or inert gas.

The sample holder can be in the form of a long rod with two distal ends. The sample holder can include a holder capsule at one distal end wherein the sample, such as the TEM grid, is positioned therein. The sample can be transferred into the sample chamber by inserting one distal end of the sample holder into the TEM column via the load lock. The sample can be imaged or processed by the charged particle beam while being held by the sample holder.

The electron beam 105 can interact with the sample 110 in such a manner as to cause various types of stimulated radiation to emanate from the sample 110, including (for example) secondary electrons, backscattered electrons, X-rays and optical radiation (cathodoluminescence). If desired, one or more of these radiation types can be detected with the aid of analysis device 155, which might be a combined scintillator/photomultiplier or EDX (Energy-Dispersive X-Ray Spectroscopy) module. However, alternatively or supplementally, one can study electrons that traverse (pass through) the sample 110, exit/emanate from the sample 110, and continue to propagate (substantially, though generally with some deflection/scattering) along axis 130.

Such a transmitted electron flux enters an imaging system (projection lens) 160, which can comprise a variety of electrostatic/magnetic lenses, deflectors, correctors (such as stigmators), and the like. In normal (non-scanning) TEM mode, this imaging system 160 can focus the transmitted electron flux. Various types of analysis apparatuses can be used downstream of imaging system 160, such as a TEM camera 165. At camera 165, the electron flux can form a static image (or diffractogram) that can be processed by controller/processor 170 and displayed on a display device (not depicted), such as a flat panel display, for example. When not required, camera 165 can be retracted/withdrawn so as to get it out of the way of axis 130. Alternatively, or additionally, the imaging system 160 can be used to focus the transmitted electron flux onto a fluorescent screen 175, which, if desired, can be retracted/withdrawn so as to get it out of the way of axis 130. An image (or diffractogram) of (part of) the sample 110 will be formed by imaging system 160 on screen 175, and this can be viewed through viewing port 180.

An analysis apparatus can also include a STEM camera 185. An output from camera 185 can be recorded as a function of (X,Y) scanning position of the beam 105 on the sample 110, and an image can be constructed that is a "map" of output from camera 185 as a function of X,Y. Camera 185 can include a single pixel with a diameter of e.g. 20 mm, as opposed to the matrix of pixels characteristically present in camera 165. Moreover, camera 185 will generally have a much higher acquisition rate (e.g., $10^6$ points per second) than camera 165 (e.g., $10^2$-$10^3$ images per second). Once again, when not required, camera 185 can be retracted/withdrawn so as to get it out of the way of axis 130.

As an alternative to imaging using cameras 165 or 185, one can also invoke spectroscopic apparatus 190, which could be an Electron Energy Loss Spectroscopy (EELS) module, for example. It should be noted that the order/location of items 165, 185, and 190 is not strict, and many possible variations are conceivable. For example, spectroscopic apparatus 190 can also be integrated into the imaging system 160.

The controller 170 is connected to various illustrated components via control lines (buses). The controller includes at least a processor as well as a non-transitory memory for storing computer readable instructions. By executing the computer readable instructions in the processor, this controller 170 can provide a variety of functions, such as synchronizing actions, providing setpoints, processing signals, performing calculations, and displaying messages/information on a display device (not depicted). The controller can be configured to implement some or all steps of the methods described herein. The controller 170 can be (partially) inside or outside the enclosure 120, and can have a unitary or composite structure, as desired.

The goniometer 196 can position the sample under the electron beam within a vacuum chamber of the microscope. The vacuum chamber can be a sample chamber 194. The sample can be imaged or processed with the charged particle beams in the sample chamber. The goniometer 196 can be coupled with enclosure 120. The goniometer can include one or more actuation mechanisms for tilting the sample around one or more tilt axes.

The goniometer 196 includes a load lock 195 to facilitate the transfer of sample 110 from external to the microscope 100 to within the sample chamber. The load lock 195 can include ingress/egress points for the sample 110 to transition from the external of the TEM to the load lock 195, and from the load lock 195 to the sample chamber of the microscope system 100. For example, the load lock 195 can include an opening at one end for receiving a sample holder from the external of TEM. The load lock can be scalable from the external environment via one or more O-rings. Similarly, the load lock 195 can also include an opening on another end (e.g. opposite end) for passing the sample held by the sample holder from the load lock 195 to the sample chamber of the microscope. The opening between the load lock and the sample chamber is scalable via a valve. Thus, when the sample 110 is positioned within the load lock 195 (via the sample holder), the environment of load lock can be substantially isolated from sample chamber.

The goniometer 196 can include a gas delivery train 197 to place the chamber into interruptible fluid communication with both a protecting source 198 and with a vacuum pump 199. The load lock 195 can be coupled with one or more gas sources and pumps via valves for controlling the gas flow into and out of the load lock 195. In one example, the load lock can be fluidically connected to a vacuum pump 199 via a first valve and fluidically connected to a protecting gas source 198 via a second valve. The valves can be open or closed by actuation respective actuators controlled by the controller 170.

The system 100 can also include a micro FFPC 191 according to the present disclosure. The micro FFPC 191 can be positioned along the axis 130. In some cases, the micro FFPC 191 can be positioned in the imaging system 160, or between the imaging system 160 and the sample 110. A laser can be coupled to the micro FFPC 191 to an external laser source (not shown), and can be configured to receive and transmit a laser emission to intersect the axis 130. The transmitted laser emission can form a standing wave intersecting the axis 130, which can interact with emissions generated by the electron beam 105 along the axis 130.

The TEM system can include other type of transmission electron microscopy systems such as a scanning transmission electron microscope. In some examples, the TEM system can include another charged particle column such as an ion column.

Figure 2:
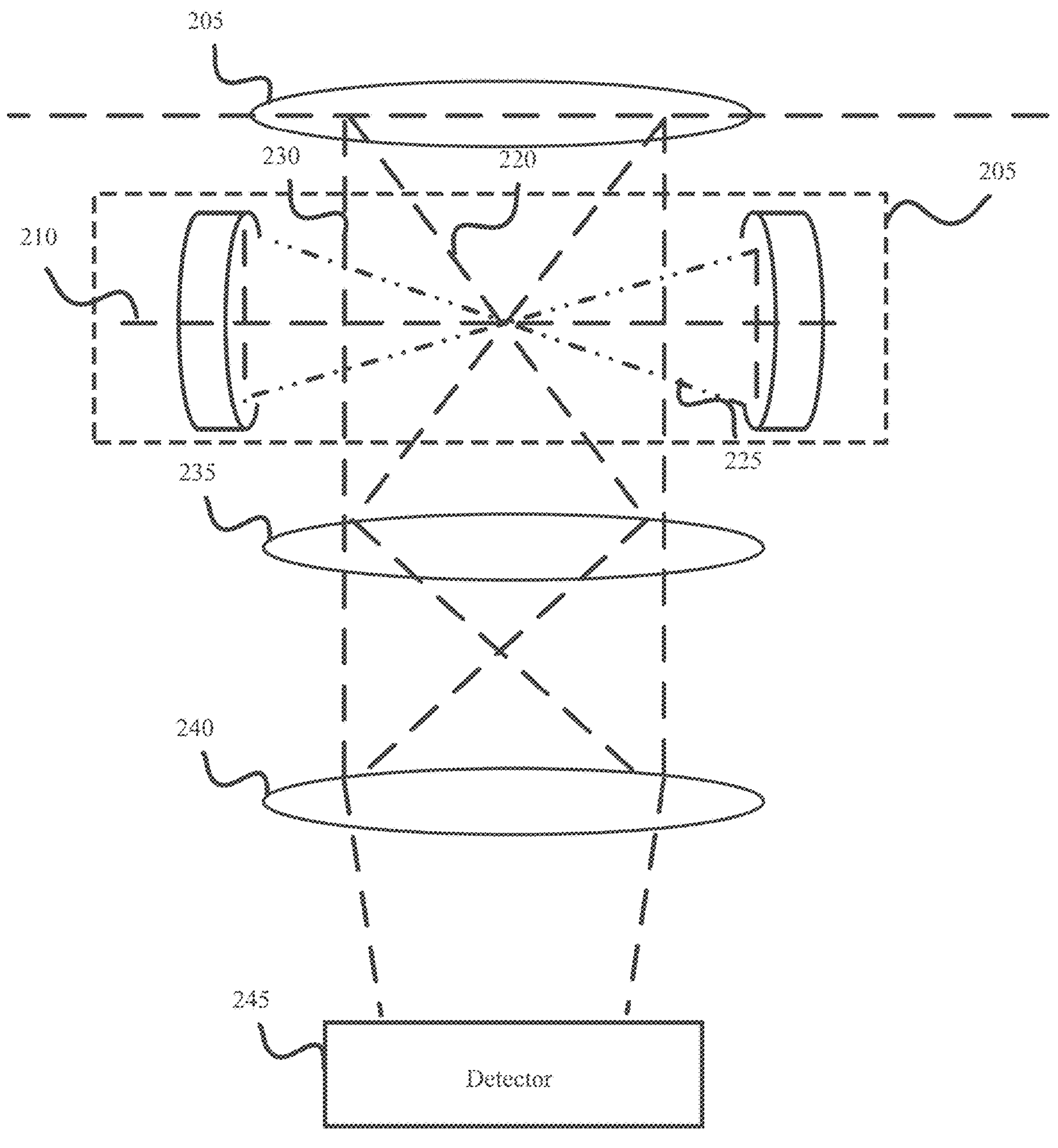
FIG. 2 depicts a microscope column configuration incorporating a micro fiber Fabry-Perot Cavity laser phase plate according to the present disclosure.

FIG. 2 depicts an example microscope column configuration 200 according to the present disclosure. The configuration 200 can be, for example, a column of a TEM, such as system 100 as described with reference to FIG. 1. For example, the configuration 200 can be part of imaging system 160, wherein the configuration 200 begins at a plane of the sample 110 of FIG. 1 and extends along electron-optical axis 130.

A micro FFPC 205 can be positioned in the back focal plane 210 of an objective lens 204. The back focal plane 210 can be a distance of a focal length away from the objective lens 204, such that emissions 220 from the charged particle beam interacting with the sample converges at the back focal plane 210. The micro FFPC 205 can contain a laser beam 225 which emissions 220 can pass through, which can provide phase shifting to the emissions 220 in relation to unscattered emissions 230.

Due to their large size, macroscopic cavities are limited to being positioned closer to the detector 245, such as between the projector lens 240 and the detector 245, or between the intermediate lens 235 and the projector lens 240. This area of the configuration 200 is typically larger in size (e.g., in diameter of the column), thereby allowing for larger cavities to be present. The micro FFPC, however, is significantly smaller in size, and can therefore be positioned further up the column, and closer to the sample, such as at the back focal plane 210).

Figure 3:
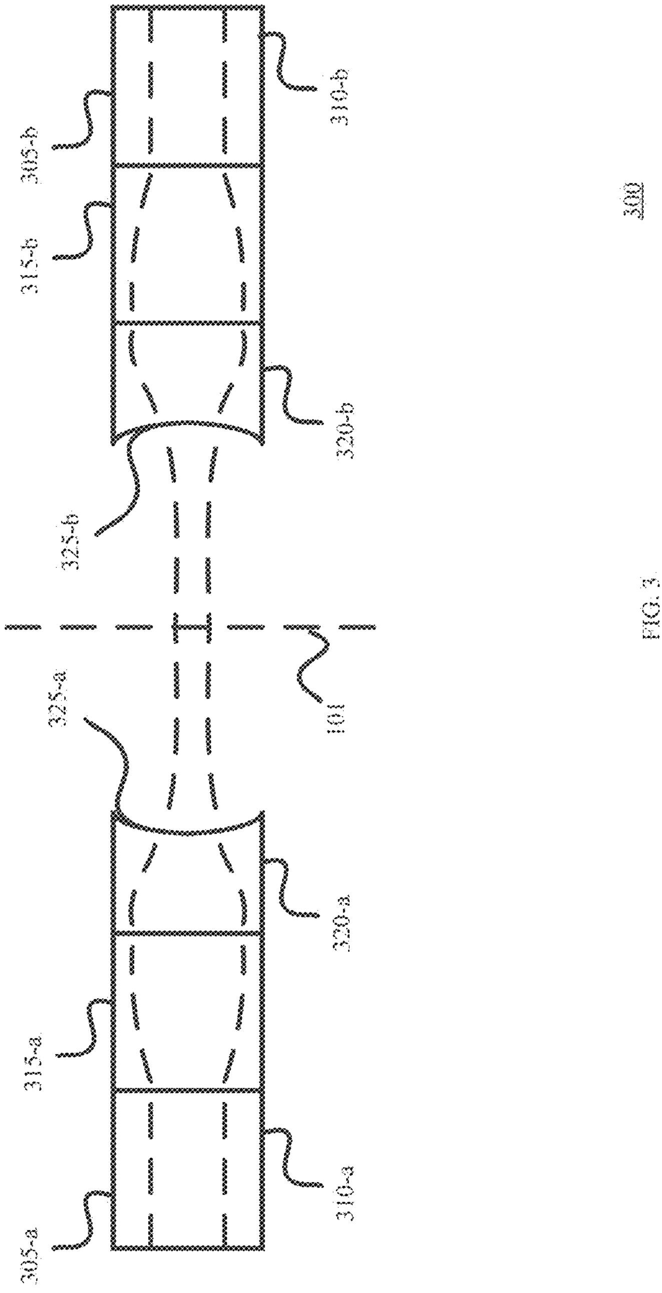
FIGS. 3, 4A, and 4B depict micro fiber Fabry-Perot Cavity laser phase plates according to the present disclosure.

FIG. 3 depicts a micro FFPC 300 according to the present disclosure. The micro FFPC 300 can include a first fiber assembly 305-*a* and a second fiber assembly 305-*b*. Each assembly 305-*a*, 305-*b* can include an entrance region 310-*a*, 310-*b*, a convergence region 315-*a*, 315-*b*, and a speculum region 320-*a*, 320-*b*, respectively.

The entrance region 310-*a*, 310-*b* can include a single-mode fiber. The entrance region 310-*a*, 310-*b* can be configured to receive a laser input, and transfer the laser to the corresponding convergence region 315-*a*, 315-*b*. The entrance region 310-*a*, 310-*b* can define a core and cladding, where the cladding envelops the core. The core can include a diameter, for example, of between 5 μm and 10 μm (e.g., with respect to the axis of transmission for the assembly 305-*a*, 305-*b*), and the cladding can include a diameter of between 100 μm and 150 μm. The core can be composed of plastic or glass, and the cladding can be composed of material having an index of refraction lower than that of the core (e.g., glass, polymers, and the like).

The convergence region 315-*a*, 315-*b* can include a gradient index fiber. The convergence region 315-*a*, 315-*b* can be configured to receive the laser input (e.g., the single-mode input) from the corresponding entrance region 310-*a*, 310-*b*, and can create mode matched laser beams along the length of the convergence region 315-*a*, 315-*b*. For example, the convergence region 315-*a*, 315-*b* can include a core and cladding. The core can include a refractive index that decreases with increasing radial distance away from the axis of transmission. The varied index of refraction can cause the laser beam to travel in a sinusoidal form along the length of the convergence region 315-*a*, 315-*b*. The core of the convergence region 315-*a*, 315-*b* can be, e.g., plastic or glass, and the cladding can be composed of material having an index of refraction lower than that of the core (e.g., glass, polymers, and the like). The core can include a diameter between 50 and 250 μm, and the cladding can include a diameter between 100 and 500 μm.

The speculum region 320-*a*, 320-*b* can include, or form, or be a mirror. For example, the speculum region 320-*a*, 320-*b* can be configured to receive the mode matched laser beams, and to transmit the laser beams towards the gap defined by the assemblies 305-*a*, 305-*b*. The speculum region 320-*a*, 320-*b* can be further configured to reflect laser beams received from the other assembly. For example, speculum region 320-*a* can be configured to reflect laser beams received from speculum region 320-*b*, and vice versa. This transmittance and reflectance of laser beams can significantly reduce input power for the laser beam (Sec, e.g., Table 1). For example, a laser can have an input power of, e.g., about 1 μW to about 1 W, about 10 μW to 0.1 W, about 100 μW to about 0.01 W, and all intermediate values. The speculum region 320-*a*, 320-*b* can be composed of a high thermal conductive substrate. In some cases, the speculum region 320-*a*, 320-*b*, can be composed of diamond. In some cases, the speculum region 320-*a*, 320-*b* can be composed of silica, or quartz.

The speculum region 320-*a*, 320-*b* can define a curved face 325-*a*, 325-*b* (e.g., or a portion of the face is curved) that faces the gap. The curved face can direct and focus the laser beam to converge at a point in the gap. The point can, in some cases, overlap with the beam path of the corresponding microscopy system, for example, electron-optical axis 130 of FIG. 1. Further, the radius of curvature of the face can be dependent on the gap distance between the assemblies 305-*a*, and 305-*b*. For example, the radius of curvature can increase with a decrease in gap length between the assemblies 305-*a*, 305-*b*. As some examples, the length of the gap can be, e.g., from 1 to 1000 μm, or from 3 to 750 μm, or from 5 to 500 μm, or from 7 to 350 μm, or from 10 to 250 μm, or from 20 to 150 μm.

In some cases, the speculum region 320-*a*, 320-*b* can include a multimode fiber. In some cases, the curved face 325-*a*, 325-*b* can be ablated or etched, such as via thermal ablation, for forming the curved face 325-*a*, 325-*b* in the speculum region 320-*a*, 320-*b*. In some cases, the mirror can be of a different composition of the speculum region 320-*a*, 320-*b*. and can be defined in the face 325-*a*, 325-*b*. For example, the speculum region 320-*a*, 320-*b* can be composed of diamond, silica, quartz, and the like. The mirror of the face 325-*a*, 325-*b* can include one or more layers of alternating high refractive index material and low refractive index material. For example, the mirror can be composed of alternating layers of titanium oxide ($TiO_2$) and silicon oxide ($SiO_2$). In some cases, the speculum region 320-*a*, 320-*b* can be composed of a high thermal conductive substrate, with the alternating layers layered on the substrate. In some cases, the mirror can be coupled to the face of the speculum region 320-*a*, 320-*b* (e.g., via adhesive, epitaxy, and the like).

In some cases, the speculum region 320-*a*, 320-*b* can include a coupling area that is flush with the corresponding convergence region 315-*a*, 315-*b*, such as those depicted in FIG. 3. In other cases, the speculum region 320-*a*, 320-*b* can further define wall 325 that extends distally away from the face of the speculum region 320-*a*, 320-*b* (e.g., along the axis of transmission). The wall 325 can define a recess which the convergence region 315-*a*, 315-*b* can be inserted. An example of the walls are depicted in FIG. 8. The speculum region 320-*a*, 320-*b* can include a diameter between 300 μm and 700 μm. In some cases, the overall length of the micro-FFPC 300 can be between 100 and 200 μm, between 100 and 500 μm, between 50 and 1,000 μm, and the like.

Figure 4A:
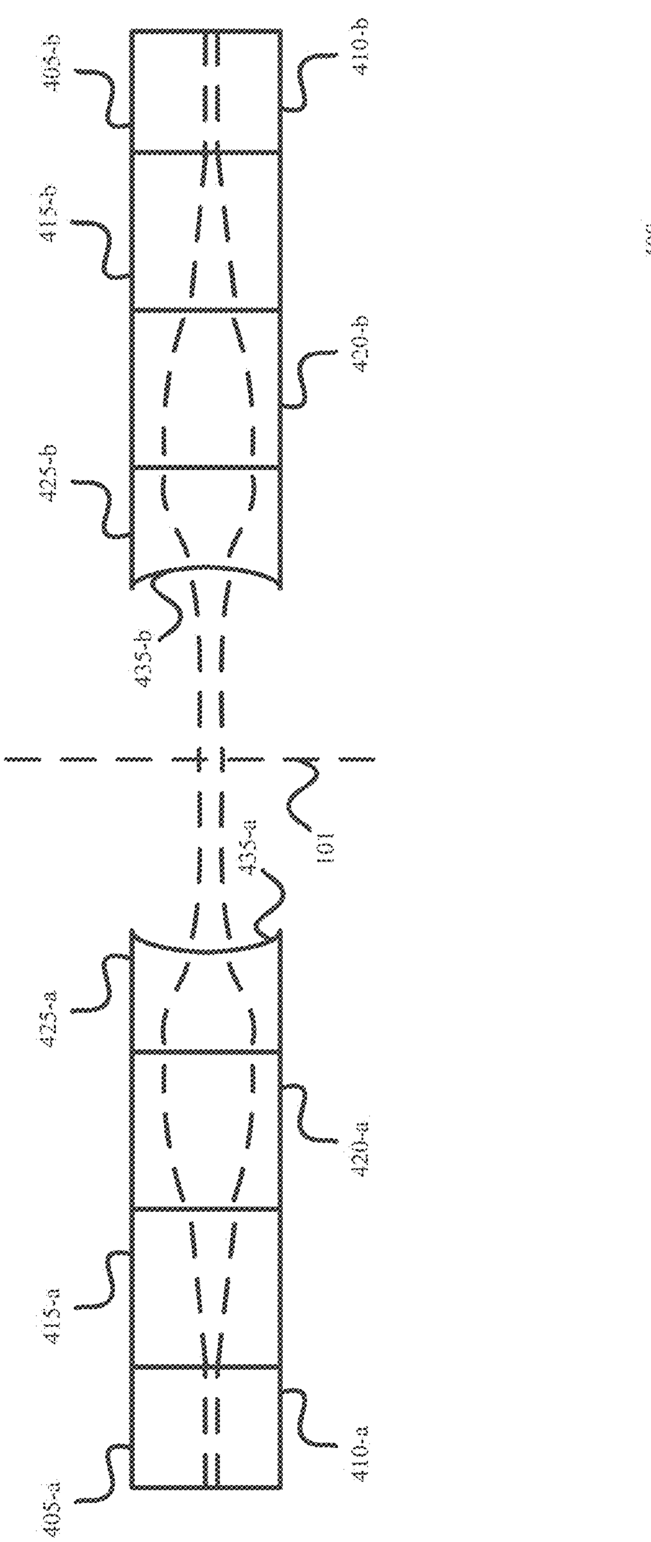
Figure 4B:
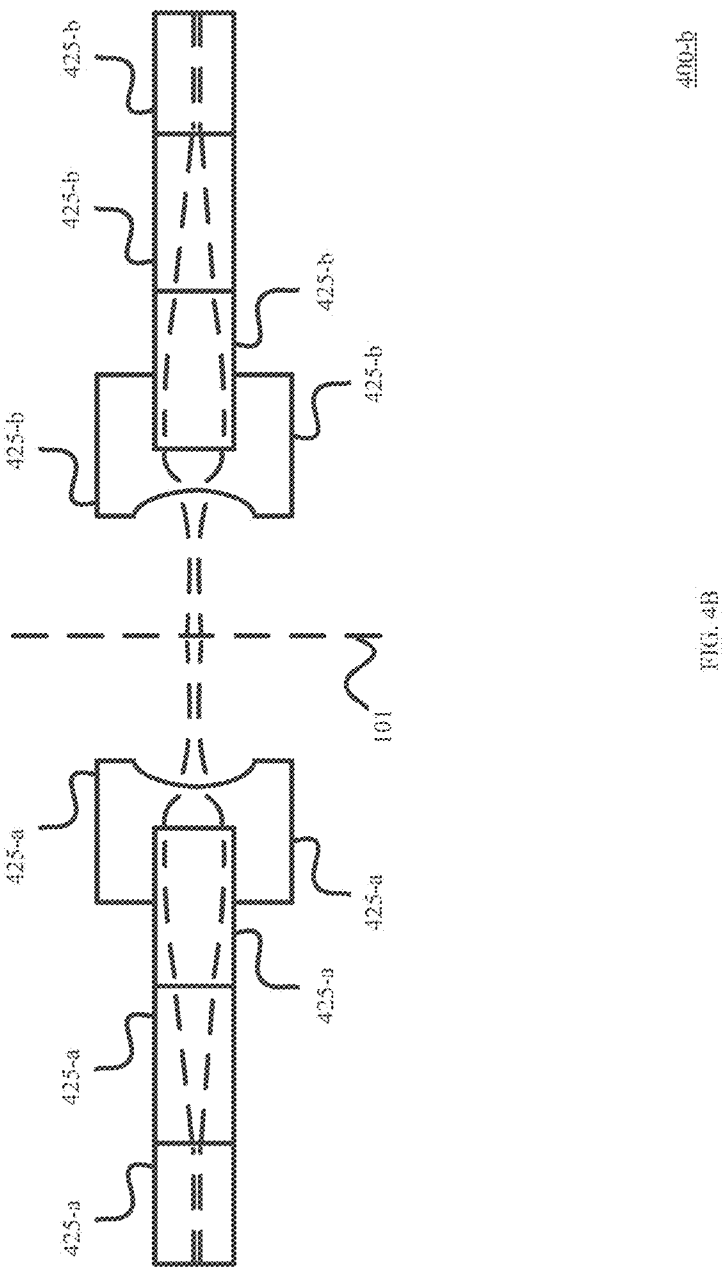

FIGS. 4A and 4B depict a micro FFPC 400 according to the present disclosure. The micro FFPC 400 can include a first fiber assembly 405-*a* and a second fiber assembly 405-*b*. Each assembly 405-*a*, 405-*b* can include an entrance region 410-*a*, 410-*b*, a spacer region 415-*a*, 415-*b*, a convergence region 420-*a*, 420-*b*, and a speculum region 425-*a*, 425-*b*, respectively.

The entrance region 410-*a*, 410-*b* can include a single-mode fiber. The entrance region 410-*a*, 410-*b* can be configured to receive a laser input, and transfer the laser to the corresponding spacer region 415-*a*, 415-*b*. The entrance region 410-*a*, 410-*b* can define a core and cladding, where the cladding envelops the core. The core can include a diameter, for example, from 1 to 1000 μm, or from 3 to 750 μm, or from 5 to 500 μm, or from 7 to 350 μm, or from 10 to 250 μm, or from 20 to 150 μm.

(e.g., with respect to the axis of transmission for the assembly 405-*a*, 405-*b*), and the cladding can include a diameter of between 100 um and 150 um. The core can be composed of plastic or glass, and the cladding can be composed of material having an index of refraction lower than that of the core (e.g., glass, polymers, and the like).

The spacer region 415-*a*, 415-*b* can include a multimode fiber. The spacer region 415-*a*, 415-*b* can be configured to receive the laser input (e.g., the single-mode input) from the corresponding entrance region 410-*a*, 410-*b*, and can generate multimode laser beams along the length of the spacer region 415-*a*, 415-*b*. The spacer region 415-*a*, 415-*b* can facilitate an increase in beam mode propagation through the respective assembly 405-*a*, 405-*b*.

The convergence region 420-*a*, 420-*b* can include a gradient index fiber. The convergence region 420-*a*, 420-*b* can be configured to receive the laser input (e.g., the single-mode input) from the corresponding spacer region 415-*a*, 415-*b*, and can create mode matched laser beams along the length of the convergence region 420-*a*, 420-*b*. For example, the convergence region 420-*a*, 420-*b* can define a core and cladding. The core can include a refractive index that decreases with increasing radial distance away from the axis of transmission. The varied index of refraction can cause the laser beam to travel in a sinusoidal form along the length of the convergence region 420-*a*, 420-*b*. The core of the convergence region 420-*a*, 420-*b* can be plastic or glass, and the cladding can be composed of material having an index of refraction lower than that of the core (e.g., glass, polymers, and the like). The core can include a diameter between 50 and 250 um, and the cladding can include a diameter between 100 and 500 um.

The speculum region 425-*a*, 425-*b* can include a mirror. For example, the speculum region 425-*a*, 425-*b* can be configured to receive the mode matched laser beams, and to transmit the laser beams towards the gap defined by the assemblies 405-*a*, 405-*b*. The speculum region 425-*a*, 425-*b* can be further configured to reflect laser beams received from the other assembly. For example, speculum region 425-*a* can be configured to reflect laser beams received from speculum region 425-*b*, and vice versa. This transmittance and reflectance of laser beams can significantly reduce input power for the laser beam (See, e.g., Table 1). In some cases, the speculum region 425-*a*, 425-*b*, can be composed of diamond. In some cases, the speculum region 425-*a*, 425-*b* can be composed of silica, or quartz.

The speculum region 425-*a*, 425-*b* can define a curved face 430-*a*, 430-*b* (e.g., or a portion of the face is curved) that faces the gap. The curved face can direct and focus the laser beam to converge at a point in the gap. The point can, in some cases, overlap with the beam path of the corresponding microscopy system, for example, electron-optical axis 1030 of FIG. 1. Further, the radius of curvature of the face can be dependent on the gap distance between the assemblies 405-*a*, and 405-*b*. For example, the radius of curvature can increase with a decrease in gap length between the assemblies 405-*a*, 405-*b*. In some cases, the radius of curvature can be between 200 and 500 um.

The speculum region 425-*a*, 425-*b* can be composed of a mirror, or can include a mirror. In some cases, the speculum region 425-*a*, 425-*b* can include a multimode fiber. In some cases, the curved face 430-*a*, 430-*b* can be ablated or etched, such as via thermal ablation, for forming the curved face 430-*a*, 430-*b* in the speculum region 425-*a*, 425-*b*. In some cases, the mirror can be of a different composition of the speculum region 425-*a*, 425-*b*. and can be defined in the face 430-*a*, 430-*b*. For example, the speculum region 425-*a*, 425-*b* can be composed of diamond, silica, quartz, and the like. The mirror of the face 430-*a*, 430-*b* can include one or more layers of alternating high refractive index material and low refractive index material. For example, the mirror can be composed of alternating layers of titanium oxide ($TiO_2$) and silicon oxide ($SiO_2$). In some cases, the mirror can be coupled to the face of the speculum region 425-*a*, 425-*b* (e.g., via adhesive, epitaxy, and the like).

In some cases, the speculum region 425-*a*, 425-*b* can include a coupling area that is flush with the corresponding convergence region 420-*a*, 420-*b*, such as those depicted in FIG. 4. In other cases, the speculum region 425-*a*, 425-*b* can further define a recess which the convergence region 420-*a*, 420-*b* can be inserted. An example of the recess is depicted in FIG. 4B. The speculum region 425-*a*, 425-*b* can include a diameter between 300 um and 700 um.

Figure 5:
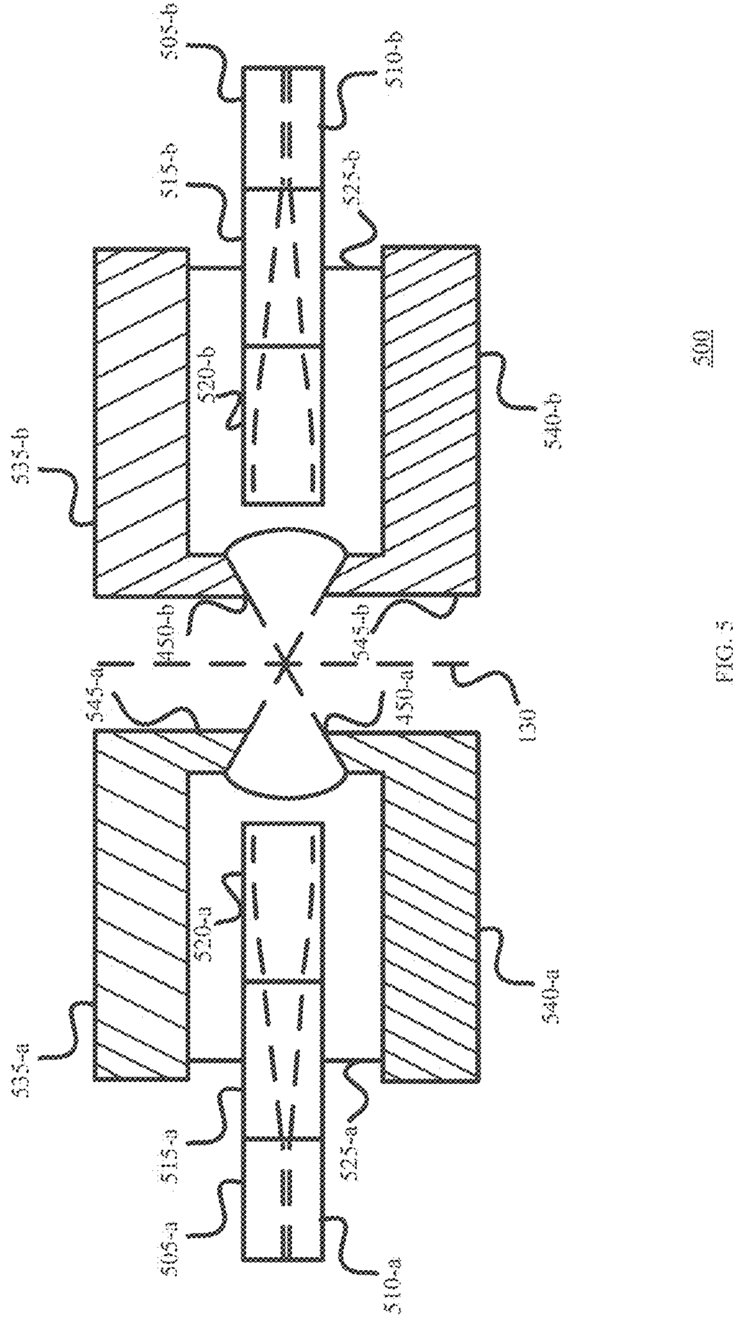
FIG. 5 depicts an assembly of cavity mirrors and heat-sinks for micro fiber Fabry-Perot Cavity laser phase plates according to the present disclosure.

FIG. 5 depicts a micro FFPC 500 according to the present disclosure. The micro FFPC 500 can include a first fiber assembly 505-*a* and a second fiber assembly 505-*b*. Each assembly 505-*a*, 505-*b* can include an entrance region 510-*a*, 510-*b*, a spacer region 515-*a*, 515-*b*, a convergence region 520-*a*, 520-*b*, and a speculum region 525-*a*, 525-*b*, respectively, which can be entrance regions, convergence regions, spacer regions, and speculum regions discussed with respect to FIGS. 3, 4A, and 4B.

The first fiber assembly 505-*a* and the second fiber assembly 505-*b* can also include heat sink 535-*a* and 535-*b*, respectively. The heat sinks 535-*a* and 535-*b* can be positioned on an exterior surface of the entrance region 510-*a*, 510-*b*, the spacer region 515-*a*, 515-*b*, the convergence region 520-*a*, 520-*b*, the speculum region 525-*a*, 525-*b*, or a combination thereof. In some cases, the heat sinks 535-*a*,

535-*b* can circumferentially extend about the axis of propagation for the laser beam. The heat sinks 535-*a*, 535-*b* can include a section 540-*a*, 540-*b* that runs perpendicular to the electron-optical axis 130 (e.g., along the length of the assembly 505-*a*, 505-*b* respectively). The heat sinks 535-*a*, 535-*b* can also include a section 545-*a*, 545*b* that runs parallel to the electron-optical axis 130. The parallel section 545-*a*, 545-*b* can define an edge 550-*a*, 550-*b*, for allowing laser emissions from the speculum region 525-*a*, 525-*b* to pass to the electron-optical axis 130. In some cases, the edge 550-*a*, 550-*b* can be shaped to minimize laser emissions from contacting the heat sink 535-*a*, 535-*b*. For example, the face of the speculum region 525-*a*, 525-*b* can be curved to converge the laser emissions emitted from the respective speculum region. The edge 550-*a*, 550-*b* can be angled to allow for this convergence to occur.

Figure 6:
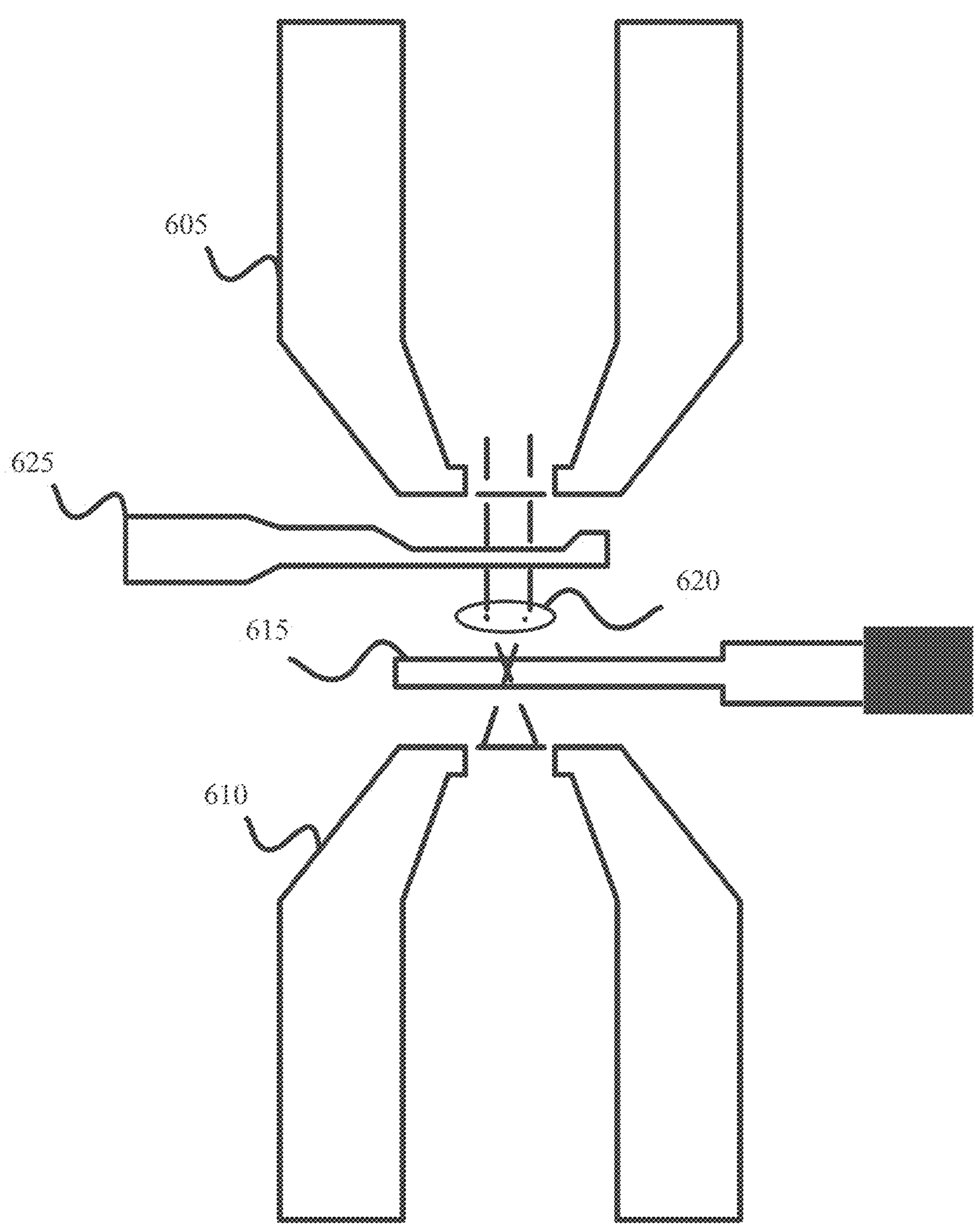
FIG. 6 depicts a microscope column incorporating a micro fiber Fabry-Perot Cavity laser phase plate according to the present disclosure.

FIG. 6 depicts a microscope column 600 according to the present disclosure. The column 600 can be implemented in a microscopy system, such as microscopy system 100 of FIG. 1. In some cases, the column 600 can include a part of imaging system 160.

In some cases, the column 600 can include magnetic lenses, which can include an upper polepiece 605 and a lower polepiece 610. In some cases, a sample plane can be located between the upper polepiece 605 and the lower polepiece 610 (e.g., along the electron-optical axis). A sample holder 625 can position a sample at the sample plane (e.g., by repositioning the distal end containing the sample, of the sample holder 625).

An aperture holder, such as aperture holder 615, can position a FFPC within the column 600. For example, a distal end of the aperture holder 615 can contain a FFPC (e.g., FFPC 200-500 described herein). The aperture holder 615 can position the FFPC such that the FFPC is positioned along the electron-optical axis. Additionally, the FFPC can be positioned downstream of the sample, but in some cases can also be positioned between the upper polepiece 605 and the lower polepiece 610. In some cases, the FFPC can be positioned at a back focal plane, such as a back focal plane of a lens 620.

Figure 7:
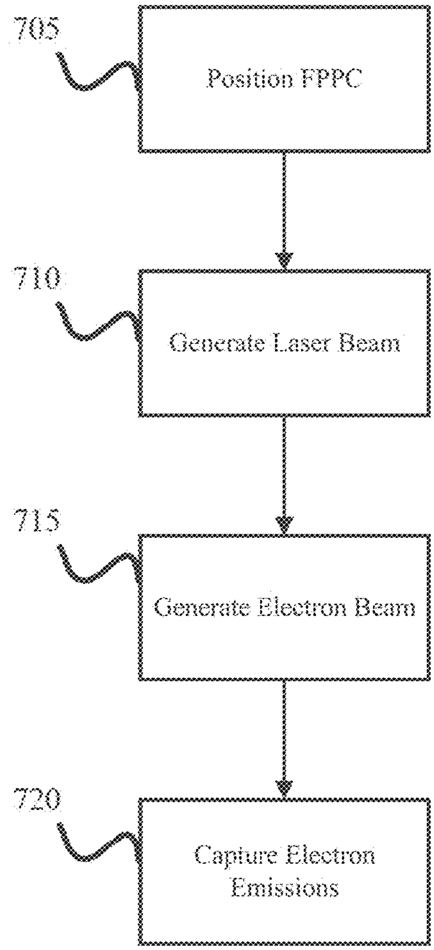
FIG. 7 depicts a process flow for utilizing a microscopy system having a micro fiber Fabry-Perot Cavity laser phase plate according to the present disclosure.

FIG. 7 depicts a process 700 for implementing a FFPC according to the present disclosure. At Step 705, a FFPC can be positioned within a microscopy system. The FFPC can be an example of FFPC 200, 300, 400-*a*, 400-*b*, 500 as described with more detail in FIGS. 2-5. In some cases, the FFPC can be positioned within a microscopy system, such as microscopy system 100 of FIG. 1. In some cases, the FFPC can be positioned within a microscope column, such as column 600 of FIG. 6. In some cases, the FFPC can be positioned between upper and lower polepieces of a magnetic lens. In some cases, the FFPC can be positioned downstream of a sample, such as at a back focal plane or diffraction plane of the sample. In some cases, the FFPC can be positioned via an aperture holder of the microscopy system.

At Step 710, a laser beam can be generated. The laser beam can pass through the FFPC, and cross the electron-optical axis of the microscopy system. At Step 715, an electron beam can be generated. The electron beam can be generated for example, by an electron source of the microscopy system. The electron beam can travel along the electron-optical beam, pass through a sample plane, and interact with the laser beam traveling from the FFPC. At Step 720, electron emissions can be captured. The electron emissions can result from the emissions interacting with the laser beam. In some cases, the electron emissions also interact with a sample of the microscopy system prior to the interaction with the laser beam. The emissions can be captured by a detector, such as by camera 165 of FIG. 1, or detector 245 of FIG. 2.

EXEMPLARY EMBODIMENTS

The following embodiments are exemplary only and do not serve to limit the scope of the present disclosure of the appended claims. It should be understood that any part of any one or more Embodiments can be combined with any part of any other one or more Embodiments.

Embodiment 1

A micro Fabry-Perot laser cavity for charged particle microscopy, comprising: a first fiber assembly and a second fiber assembly, wherein each of the first fiber and the second fiber assembly comprises: an entrance region comprising a single-mode fiber; a spacer region comprising a multimode fiber or a transparent substrate; a convergence region comprising a gradient index fiber or gradient index lens; and a speculum region comprising a multimode fiber or a transparent substrate, the entrance region, spacer region, the convergence region, and the speculum region being in optical communication with one another, and wherein a face of the speculum region of the first fiber assembly faces a face of the speculum region of the second fiber assembly, thereby defining a gap therebetween.

Embodiment 2

The micro Fabry-Perot laser cavity of Embodiment 1, wherein the gradient index fiber or gradient index lens is configured to receive a broadened laser beam diameter from the multimode fiber or transparent substrate in the spacer region and mode match the laser beam to the mirror radiance of curvature in the speculum region and the gap.

Embodiment 3

The micro Fabry-Perot laser cavity of any one of Embodiments 1 or 2, wherein a length of the gap comprises between 1 μm and 1000 μm. As some examples, the length of the gap can be, e.g., from 1 to 1000 μm, or from 3 to 750 μm, or from 5 to 500 μm, or from 7 to 350 μm, or from 10 to 250 μm, or from 20 to 150 μm.

Embodiment 4

The micro Fabry-Perot laser cavity of any one of Embodiments 1 to 3, wherein the each of the first fiber assembly and the second fiber assembly is configured to transport a laser beam having an input power of from about 1 μW to about 1 W. A laser can have an input power of, e.g., about 1 μW to about 1 W, about 10 μW to 0.1 W, about 100 μW to about 0.01 W, and all intermediate values.

Embodiment 5

The micro Fabry-Perot laser cavity of any one of Embodiments 1 to 4, wherein a core diameter of each of the first fiber assembly and the second fiber assembly is in the range of from between about 1 μm and about 1000 μm. As some examples, a core diameter can be, e.g., from 1 to 1000 μm, or from 3 to 750 μm, or from 5 to 500 μm, or from 7 to 350 μm, or from 10 to 250 μm, or from 20 to 150 μm.

Embodiment 6

The micro Fabry-Perot laser cavity of any one of Embodiments 1 to 5, wherein the face of the speculum region of each of the first fiber assembly and the second fiber assembly comprises a mirror.

Embodiment 7

The micro Fabry-Perot laser cavity of any one of Embodiments 1 to 6, wherein the speculum region for at least one of the first fiber assembly and the second comprises diamond, the diamond optionally comprising a dielectric reflective coating, the dielectric reflective coating optionally comprising at least a first layer and a second layer, the first layer and the second layer having different reflective indices.

Embodiment 8

The micro Fabry-Perot laser cavity of any one of Embodiments 1 to 7, wherein the micro Fabry-Perot laser cavity is configured to be positioned in a beam column of a charged particle microscope such that a portion of the charged particle beam of the charged particle microscope passes through the gap of the micro Fabry-Perot laser cavity.

Embodiment 9

The micro Fabry-Perot laser cavity of any one of Embodiments 1 to 8, wherein the micro Fabry-Perot laser cavity is configured to be positioned between an upper polepiece of a magnetic lens of the charged particle microscope and a lower polepiece of the magnetic lens of the charged particle microscope.

Embodiment 10

The micro Fabry-Perot laser cavity of any one of Embodiments 1 to 9, further comprising a dielectric coating covering at least a portion of the face of the first fiber assembly and the face of the second fiber assembly.

Embodiment 11

The micro Fabry-Perot laser cavity of any one of Embodiments 1 to 10, further comprising a thermal sink in contact with the speculum region of at least one of the first fiber assembly and the second fiber assembly.

Embodiment 12

The micro Fabry-Perot laser cavity of any one of Embodiments 1 to 11, further comprising an electrical shield positioned in the gap and configured to reduce an electrical charge buildup on the face of the first fiber assembly and the face of the second fiber assembly from a charged beam travelling through the gap.

Embodiment 13

A method, comprising: generating, by a charged particle microscope, a charged electron beam, wherein the charged beam travels through a beam column of the charged particle microscope; generating, by a micro Fabry-Perot laser cavity positioned between an upper polepiece and a lower polepiece of the beam column, in the back focal plane of a sample, a laser beam, wherein a portion the charged particle beam propagates through the laser beam and interacts with the laser beam in the beam column; and capturing, by a charged particle detector of the charged particle microscope, a charged particle image resulting from the interaction.

Embodiment 14

The method of Embodiment 13, wherein the charged particle beam further interacts with a sample positioned in the beam column of the charged particle microscope.

Embodiment 15

The method of any one of Embodiments 13 or 14, wherein the sample comprises a soft tissue sample.

Embodiment 16

A method of any one of Embodiments 13 to 15, wherein the charged particle beam is captured as an image.

Embodiment 17

A charged particle microscope, comprising: a charged particle source configured to generate a charged particle beam; a beam column defining a micro Fabry-Perot cavity through which the generated particle beam travels; a magnetic lens defining an upper polepiece and a lower polepiece and housed in the beam column; and a micro Fabry-Perot laser cavity housed in the beam column and positioned between the upper polepiece and the lower polepiece, wherein the micro Fabry-Perot laser cavity is configured to generate a laser beam that travels through the charged particle beam, and optionally the laser beam having an input power of from about 1 μW to about 1 W, or the micro Fabry-Perot laser cavity defining a gap in the range of from about 1 μm to about 1000 μm, the gap configured such that the laser beam passes therethrough, or both (a) and (b). The length of the gap can be, e.g., from 1 to 1000 μm, or from 3 to 750 μm, or from 5 to 500 μm, or from 7 to 350 μm, or from 10 to 250 μm, or from 20 to 150 μm.

Embodiment 18

The charged particle microscope of Embodiment 17, further comprising a sample holder defining a speculum end, wherein the speculum end is configured to hold a sample and be positioned (i) between the upper polepiece and the lower polepiece, and (ii) in a travel path of the charged particle beam.

Embodiment 19

The charged particle microscope of any one of Embodiments 17 or 18, wherein the micro Fabry-Perot laser cavity is further configured to be positioned between the speculum end of the sample holder and the lower polepiece.

Embodiment 20

The charged particle microscope of any one of Embodiments 17 to 19, further comprising a laser cavity holder defining a speculum end, wherein the speculum end of the micro Fabry-Perot laser cavity holder is (i) configured to hold the micro Fabry-Perot laser cavity, and (ii) positioned in a travel path of the charged particle beam.

What is claimed:

1. A micro Fabry-Perot laser cavity for charged particle microscopy, comprising:

a first fiber assembly and a second fiber assembly, wherein each of the first fiber assembly and the second fiber assembly comprises:

an entrance region comprising a single-mode fiber;

a spacer region comprising a multimode fiber or a transparent substrate;

a convergence region comprising a gradient index fiber or gradient index lens; and a speculum region comprising a multimode fiber or a transparent substrate, the entrance region, spacer region, the convergence region, and the speculum region being in optical communication with one another, and wherein a face of the speculum region of the first fiber assembly faces a face of the speculum region of the second fiber assembly, thereby defining a gap therebetween.

2. The micro Fabry-Perot laser cavity of claim 1, wherein the gradient index fiber or gradient index lens is configured to receive a broadened laser beam diameter of a laser beam from the multimode fiber or transparent substrate in the spacer region and mode match the laser beam to a mirror radiance of curvature in the speculum region and the gap.

3. The micro Fabry-Perot laser cavity of claim 1, wherein a length of the gap comprises between 1 μm and 1000 μm.

4. The micro Fabry-Perot laser cavity of claim 1, wherein the each of the first fiber assembly and the second fiber assembly is configured to transport a laser beam having an input power of from about 1 μW to about 1 W.

5. The micro Fabry-Perot laser cavity of claim 1, wherein a core diameter of each of the first fiber assembly and the second fiber assembly is in a range of from between about 1 μm and about 1000 μm.

6. The micro Fabry-Perot laser cavity of claim 1, wherein the face of the speculum region of each of the first fiber assembly and the second fiber assembly comprises a mirror.

7. The micro Fabry-Perot laser cavity of claim 1, wherein the speculum region for at least one of the first fiber assembly and the second fiber assembly comprises a high thermal conductive substrate, the high thermal conductive substrate optionally comprising a dielectric reflective coating, the dielectric reflective coating optionally comprising at least a first layer and a second layer, the first layer and the second layer having different reflective indices.

8. The micro Fabry-Perot laser cavity of claim 1, wherein the micro Fabry-Perot laser cavity is configured to be positioned in a column of a charged particle microscope such that a portion of a charged particle beam of the charged particle microscope passes through the gap.

9. The micro Fabry-Perot laser cavity of claim 8, wherein the micro Fabry-Perot laser cavity is configured to be positioned at a diffraction focal plane downstream of a sample, wherein the diffraction focal plane is located between an upper polepiece of a magnetic lens of the charged particle microscope and a lower polepiece of the magnetic lens of the charged particle microscope.

10. The micro Fabry-Perot laser cavity of claim 1, further comprising a dielectric coating covering at least a portion of the face of the first fiber assembly and the face of the second fiber assembly.

11. The micro Fabry-Perot laser cavity of claim 1, further comprising a thermal sink in contact with the speculum region of at least one of the first fiber assembly and the second fiber assembly.

12. The micro Fabry-Perot laser cavity of claim 1, further comprising an electrical shield positioned in the gap and configured to reduce an electrical charge buildup on the face of the first fiber assembly and the face of the second fiber assembly from a charged beam travelling through the gap.

13. A method, comprising:

generating, by a charged particle microscope, a charged particle beam, wherein the charged particle beam travels through a beam column of the charged particle microscope;

generating, by a micro Fabry-Perot laser cavity positioned at a back focal plane of the charged particle microscope, a standing wave, wherein a portion of the charged particle beam propagates through the standing wave and experiences an interaction with the standing wave in the beam column; and capturing, by a charged particle detector of the charged particle microscope, a charged particle image resulting from the interaction.

14. The method of claim 13, wherein the charged particle beam further interacts with a sample positioned in the beam column of the charged particle microscope.

15. The method of claim 14, wherein the sample comprises a soft tissue sample.

16. The method of claim 13, wherein the charged particle beam is captured as an image.

17. A charged particle microscope, comprising:

a charged particle source configured to generate a charged particle beam;

a beam column defining a micro Fabry-Perot cavity through which the charged particle beam travels;

a magnetic lens defining an upper polepiece and a lower polepiece and housed in the beam column; and a micro Fabry-Perot laser cavity housed in the beam column and positioned between the upper polepiece and the lower polepiece, wherein the micro Fabry-Perot laser cavity is configured to generate a laser beam that travels through the charged particle beam, and optionally (a) the laser beam having an input power of from about 1 μW to about 1 W, or (b) the micro Fabry-Perot laser cavity defining a gap in a range of from about 1 μm to about 1000 μm, the gap configured such that the laser beam passes therethrough, or (c) both (a) and (b).

18. The charged particle microscope of claim 17, further comprising a sample holder defining a speculum end, wherein the speculum end is configured to hold a sample and be positioned (i) between the upper polepiece and the lower polepiece, and (ii) in a travel path of the charged particle beam.

19. The charged particle microscope of claim 18, wherein the micro Fabry-Perot laser cavity is further configured to be positioned between the speculum end of the sample holder and the lower polepiece.

20. The charged particle microscope of claim 17, further comprising a laser cavity holder defining a speculum end, wherein the speculum end of the micro Fabry-Perot laser cavity is (i) configured to hold the micro Fabry-Perot laser cavity, and (ii) positioned in a travel path of the charged particle beam.

* * * * *